US010097173B2

(12) United States Patent
Wang et al.

(10) Patent No.: US 10,097,173 B2
(45) Date of Patent: Oct. 9, 2018

(54) SWITCH CONTROL DEVICE AND METHOD FOR POWER

(71) Applicant: CLOUD NETWORK TECHNOLOGY SINGAPORE PTE. LTD., Singapore (SG)

(72) Inventors: Chia-Peng Wang, New Taipei (TW); Yu-Shiuan Tsao, New Taipei (TW)

(73) Assignee: Cloud Network Technology Singapore Pte. Ltd., Singapore (SG)

( * ) Notice: Subject to any disclaimer, the term of this patent is extended or adjusted under 35 U.S.C. 154(b) by 346 days.

(21) Appl. No.: 14/871,224

(22) Filed: Sep. 30, 2015

(65) Prior Publication Data

US 2017/0093391 A1  Mar. 30, 2017

(30) Foreign Application Priority Data

Sep. 25, 2015  (TW) .............................. 104131961 A (51) Int. Cl.
*H01H 19/14* (2006.01)
*H03K 17/13* (2006.01)

(52) U.S. Cl.
CPC ................................. *H03K 17/136* (2013.01)

(58) Field of Classification Search
CPC .................................................. H03K 17/136
USPC ....................................................... 307/115
See application file for complete search history.

(56) References Cited

U.S. PATENT DOCUMENTS

| 2004/0076148 A1* | 4/2004 | Ferry | H02J 9/06 370/389 |
| 2008/0054878 A1* | 3/2008 | Satoh | H02J 3/38 324/76.11 |
| 2008/0174181 A1* | 7/2008 | Kuo | H02J 9/06 307/80 |
| 2013/0106190 A1* | 5/2013 | Lin | H02J 9/061 307/64 |
| 2014/0183956 A1* | 7/2014 | Wang | H02J 9/062 307/64 |
| 2014/0254050 A1* | 9/2014 | Haines | G01R 31/3277 361/42 |

\* cited by examiner

*Primary Examiner* — Rexford Barnie
*Assistant Examiner* — Toan Vu
(74) *Attorney, Agent, or Firm* — ScienBiziP, P.C.

(57) ABSTRACT

A switch control device includes a switch device and a control device. The switch device includes first and second input terminals, an output terminal, a processor, and a plurality of delays. The processor is configured to detect period of an input voltage from the first input terminal, and to determine whether the input voltage is normal. A delay time can be computed by the processor, according to the period of the input voltage and a release time of the each delay. If the input voltage from the first input terminal is abnormal, the processor detects a zero voltage crossing signal or a peak of voltage signal, and delays the zero voltage crossover signal or the peak of voltage signal for a delay time, to control the delays coupled to the first input terminal to turn on.

7 Claims, 11 Drawing Sheets

SWITCH CONTROL DEVICE AND METHOD FOR POWER

FIELD

The subject matter herein generally relates to a switch control device and method for power.

BACKGROUND

A double input power source or a single input power source usually supplies power to an output through a switch device. The switch device usually may include a first relay, a second relay, and a silicon controlled rectifier (SCR) coupled to the first relay in parallel. However, the switch device will be damaged due to the SCR operating but not until the second relay is turned on.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently coupled or releasably coupled. The term "comprising," when utilized, means "including, but not necessarily limited to"; it specifically indicates open-ended inclusion or membership in the so-described combination, group, series and the like.

The disclosure will now be described in relation to an electronic device with a switch control device for power.

Figure 1:
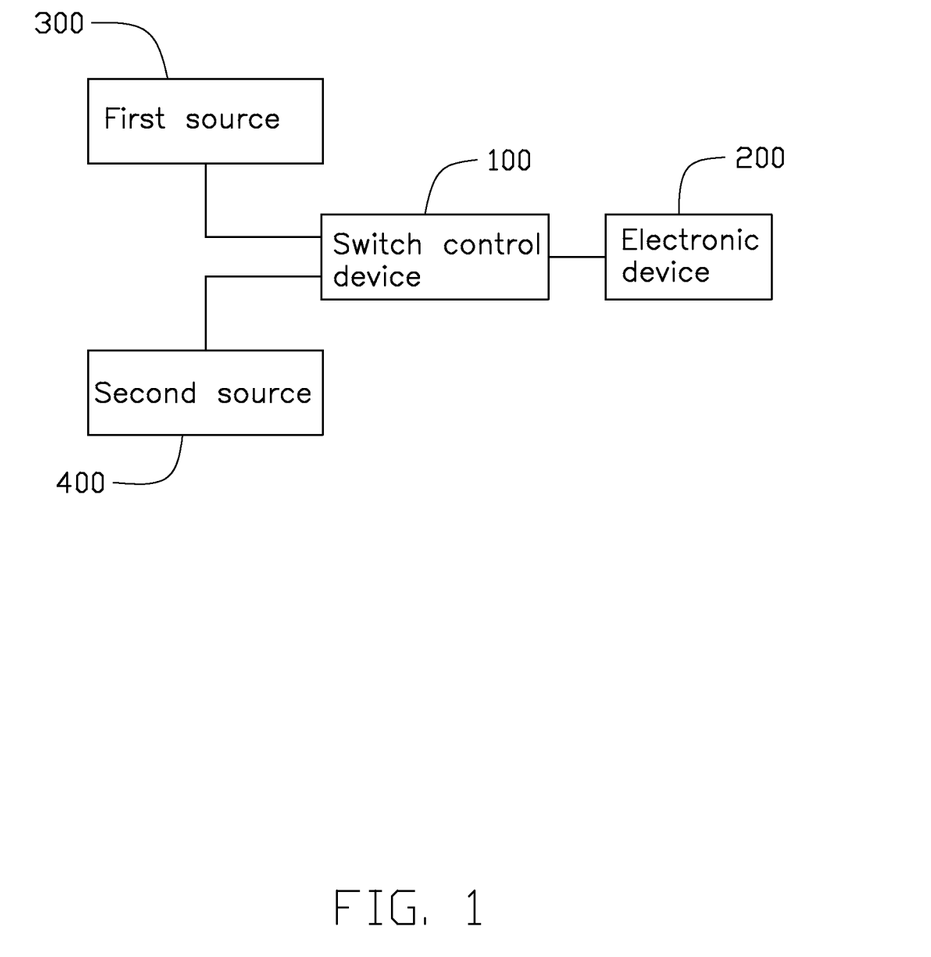
FIG. 1 is a block diagram of an embodiment of an switch control device coupled to a first power source, a second power source, and an electronic device.

FIG. 1 illustrates a schematic diagram of an embodiment of an switch control device 100 coupled to a first power source 300, a second power source 400, and an electronic device 200. The switch control device 100 is configured to switch between the first power source 300 and the second power source 400, to supply voltage from the first power source 300 or the second power source 400 to the electronic device 200.

Figure 2:
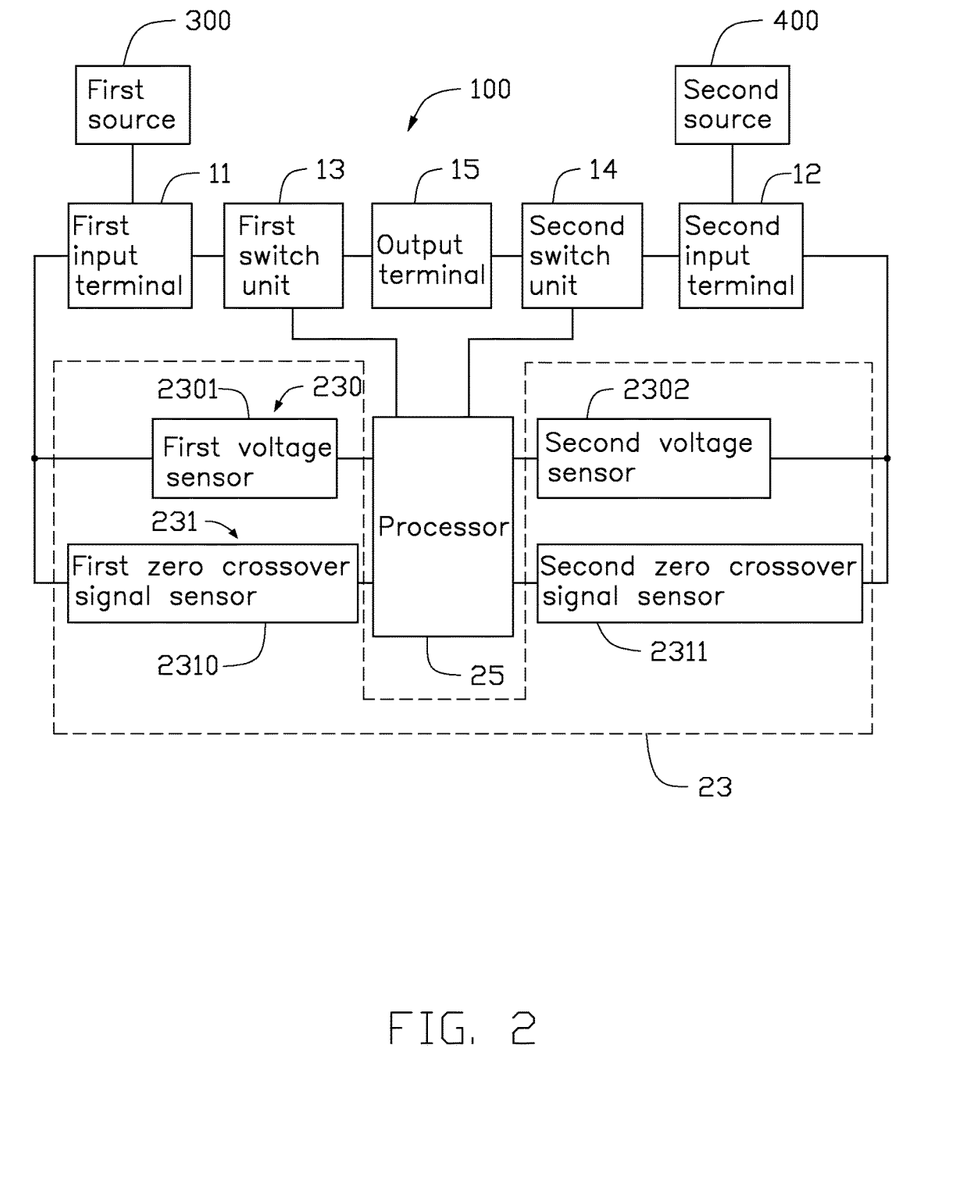
FIG. 2 is a block diagram of a first embodiment of the switch control device of FIG. 1.

FIG. 2 illustrates a block diagram of a first embodiment of the switch control device 100 of FIG. 1. The switch control device 100 includes a switch device 10 and a control device 20. In at least one embodiment, the switch device 10 is an automatic transfer switch. The switch device 10 includes a first input terminal 11, a second input terminal 12, a first switch unit 13, a second switch unit 14, and an output terminal 15. The first input terminal 11 and the second input terminal 12 are coupled to the first power source 300 and the second power source 400 respectively. The output terminal 15 receives a first input voltage from the first power source 300 through the first input terminal 11, or receives a second input voltage from the second power source 400 through the second input terminal 12. The control device 20 includes a detection unit 23 and a processor 25. The detection unit 23 includes a voltage sensor 230 and a zero crossover signal sensor 231. The voltage sensor 230 includes a first voltage sensor 2301 and a second voltage sensor 2302. The zero crossover signal sensor 231 includes a first zero crossover signal sensor 2310 and a second zero crossover signal sensor 2312. The first zero crossover signal sensor 2310 and a second zero crossover signal sensor 2311 and the first zero crossover signal sensor 2310 are coupled to the first input terminal 11 and the processor 25. The second voltage sensor 2302 and the second zero crossover signal sensor 2311 are coupled to the second input terminal 12 and the processor 25. The processor 25 are coupled to the first switch unit 13 and the second switch unit 14.

Figure 3:
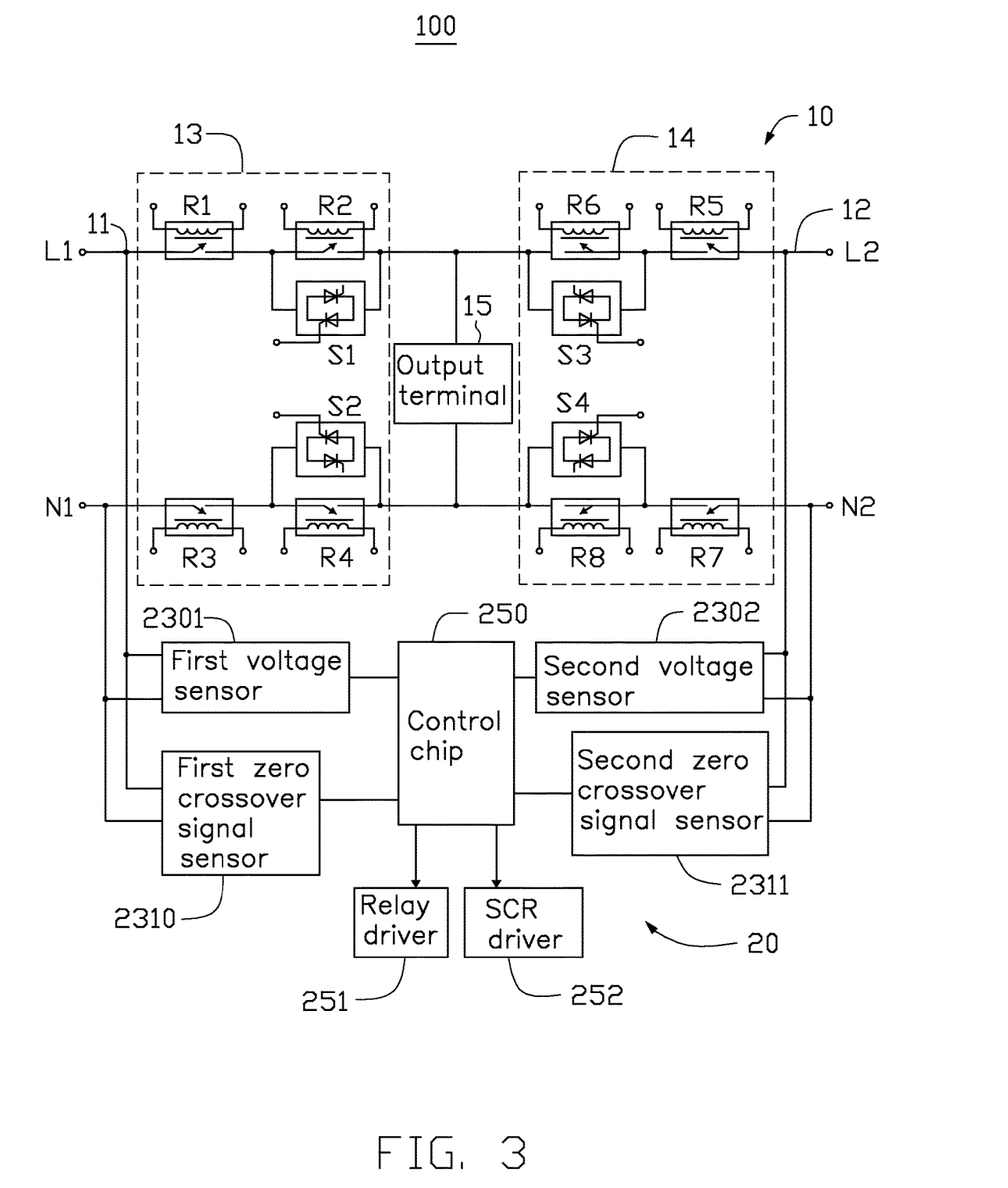
FIG. 3 is a circuit diagram of the first embodiment of the switch control device of FIG. 1, wherein the switch control device may receive an input voltage, and comprise at least one relay.

FIG. 3 illustrates a circuit diagram of the first embodiment of the switch control device 100 of FIG. 1. Both of the first input terminal 11 and the second input terminal 12 are coupled to the a municipal electric power. The first switch unit 13 includes first level relay unit and a second level relay unit. The first level relay unit of the first switch unit 13 includes relays R1 and R2. The second level relay unit of the first switch unit 13 includes relays R3 and R4, and two silicon controlled rectifiers (SCRs) S1 and S2. The two SCRs S1 and S2 are coupled to the relays R3 and R4 in parallel. The second switch unit 14 includes first level relay unit and a second level relay unit. The first level relay unit of the second switch unit 14 includes relays R5 and R6. The second level relay unit of the second switch unit 14 includes relays R7 and R8, and two silicon controlled rectifiers (SCRs) S3 and S4. The two SCRs S3 and S4 are coupled to the relays R7 and R8 in parallel. The relays R1 and R2 are coupled in series, and are coupled between a live wire L1 of the municipal electric power and the output terminal 15. The relays R3 and R4 are coupled in series, and are coupled between a neutral wire N1 of the municipal electric power and the output terminal 15. Each of the SCR is composed of two single thyristors coupled in parallel. A first terminal of the SCR S1 is coupled to a node between the relay R1 and the relay R2. A second terminal of the SCR S1 is coupled to the output terminal 15. A second terminal of the SCR S2 is coupled to a node between the relay R3 and the relay R4. A second terminal of the SCR S2 is coupled to the output terminal 15. The relays R5 and R6 are coupled in series, and are coupled between a live wire L2 of the municipal electric power and the output terminal 15. The relays R7 and R8 are coupled in series, and are coupled between a neutral wire N2 of the municipal electric power and the output terminal 15. A first terminal of the SCR S3 is coupled to a node between the relays R5 and R6. A second terminal of the SCR S3 is coupled to the output terminal 15. A first terminal of the SCR S4 is coupled to the node between the relays R7 and R8. A second terminal of the SCR S4 is coupled to the output terminal 15.

The processor 25 includes a control chip 250, a relay driver 251, and a SCR driver 252. Each of the relays R1, R2, R3, R4, R5, R6, R7, and R8 is coupled to the processor 25 through the relay driver 251. Each control terminal of the SCR S1, S2, S3, and S4 is coupled to the processor 25 through the SCR driver 252. The relay driver 251 and the SCR driver 252 can make functions as adjusting voltages of the relays R1, R2, R3, R4, R5, R6, R7, and R8 and the SCR S1, S2, S3, and S4.

In at least one embodiment, the SCR S1 and S2 can promote a transmission time from the first input terminal 11 to the output terminal 15. The SCR S3 and S4 can promote a transmission time from the second input terminal 12 to the output terminal 15. Each of the SCR can reduce a voltage drop of the corresponding relay coupled in parallel. Therefore, arc discharge generated by the relays R2, R4, R6, R8 can be reduced.

In use, when the output terminal 15 receives a first input voltage from the first input terminal 11, the first voltage sensor 2301 senses the first input voltage, and transmits the first input voltage to the processor 25. The first zero crossover signal sensor 2310 senses a zero crossover signal of the first input voltage, and transmits the zero crossover signal of the first input voltage to the processor 25. The processor 25 detects a period T of the first input voltage through the first voltage sensor 2301, and determines whether the first input voltage is normal or not. If the first input voltage is abnormal, the processor 25 computes a delay time $T_{Delay}$ according to the period T of the first input voltage and a charge time $T_{Operate}$ of relays R1 and R3 of the first level relay unit of the first switch unit 13, and determines when to output a control signal to turn on the relays R1 and R3 of the first switch unit 13 according to the delay time $T_{Delay}$ and the zero crossover signal of the first input voltage. Therefore, a voltage generated by the operation of turn on the relays R1 and R3 instantly will be reduce.

Each relay usually includes a coil and a plurality of contacts. In at least one embodiment, the charge time $T_{Operate}$ is a period started from the coil of one relay receiving a turn on signal until the contacts of the relay contacting to each other, and the delay time $T_{Delay}$ is a period between the processor 25 detects the zero crossover signal (ZCD) of the first input voltage and outputs control signal to the relays, to make the relays to disconnect.

Figure 4:
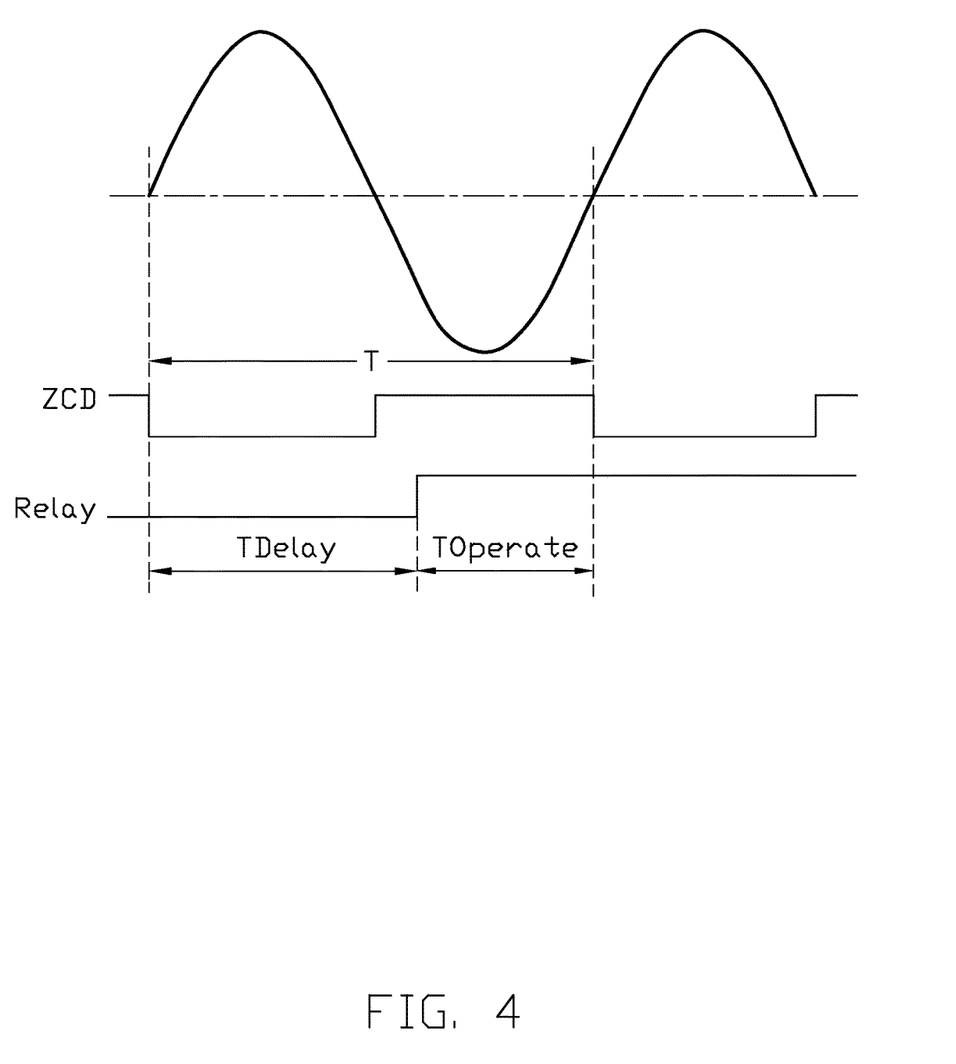
FIG. 4 is a waveform schematic diagram of the input voltage relating to a first zero crossover signal of the input voltage, which to determine a delay time of the relay of the first embodiment of the switch control device of FIG. 1.
Figure 5:
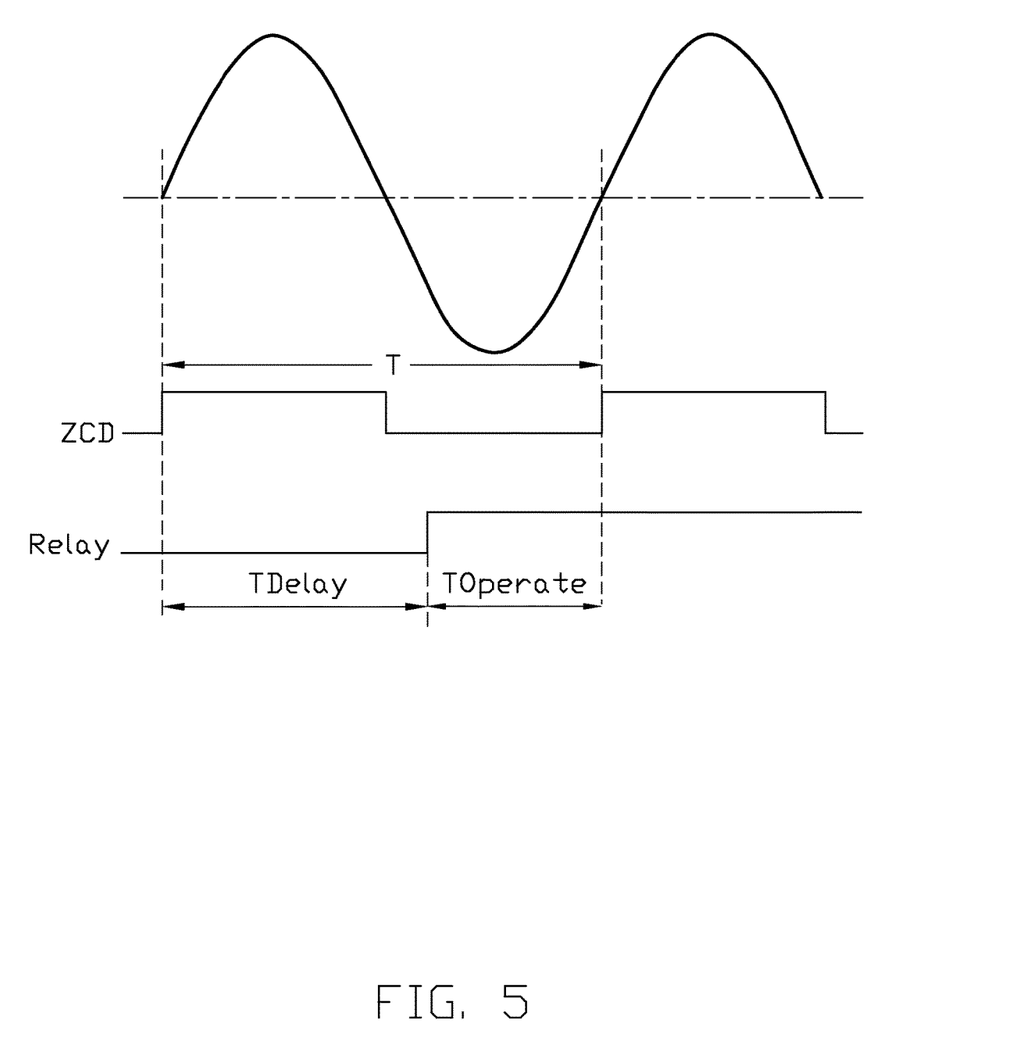
FIG. 5 is a waveform schematic diagram of the input voltage relating to a second zero crossover signal of the input voltage, which to determine a time of the relay of the first embodiment of the switch control device of FIG. 1.
Figure 6:
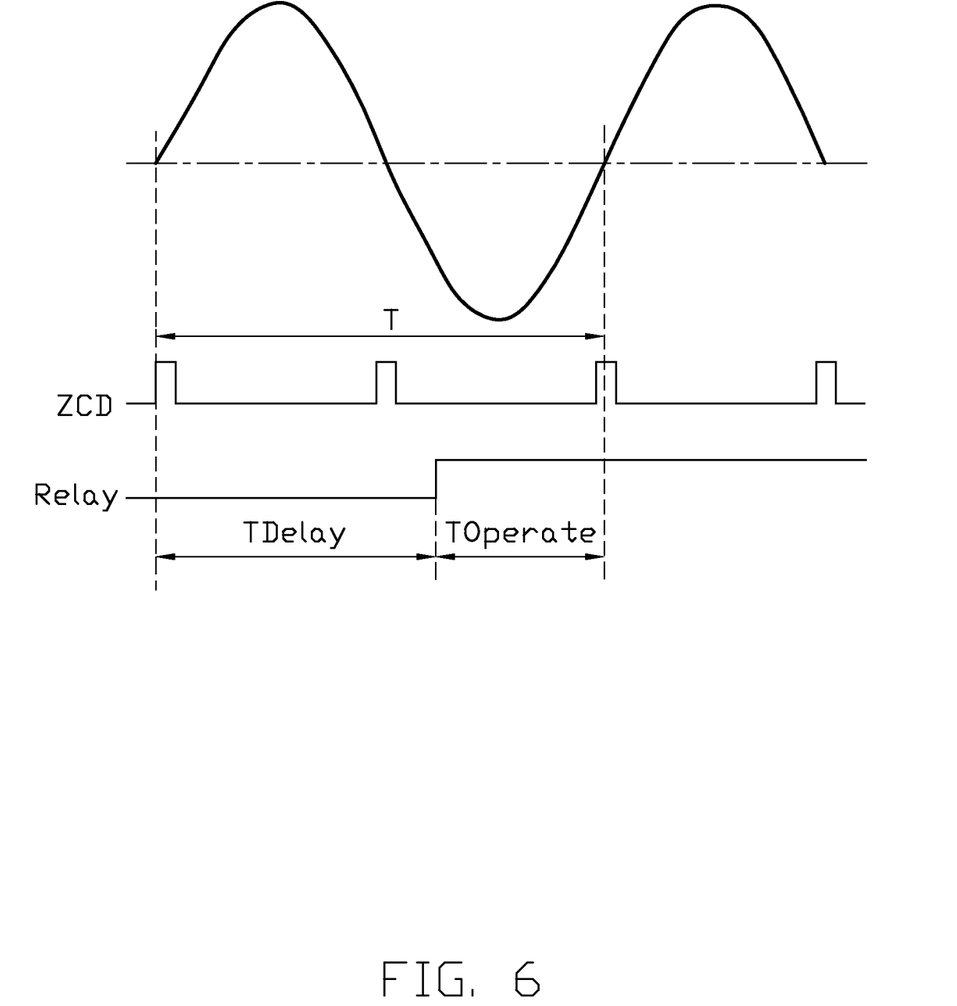
FIG. 6 is a waveform schematic diagram of the input voltage relating to a third zero crossover signal of the input voltage, which to determine a time of the relay of the first embodiment of the switch control device of FIG. 1.

FIGS. 4 to 6 illustrates waveform schematic diagrams of the first input voltage relating to three forms of zero crossover signal (ZCD) of the first input voltage, which make the processor 25 to determine when to output the delay time $T_{Delay}$ of each relay (Delay) of the first switch unit 13. In at least one embodiment, a relationship between the $T_{Delay}$ and the $T_{Operate}$ as formula: $T_{Delay}=T-T_{Operate}$.

Therefore, the processor 25 detects the zero crossover signal (ZCD) of the first input voltage and outputs the control signal to the relays R1 and R3 of the first switch unit 13 after the delay time $T_{Delay}$, to make the relays R1 and R3 operating. When the contacts of the relays R1 and R3 of the first switch unit 13 coupled to the first input terminal 11 turn on, and then the relays R2 and R4 will be turned on after a few time. Therefore, a voltage generated by the operation of turn on the relays R1 and R3 instantly will be reduce, which will avoid the SCRs S1 and S2 are turned on not until the relays R2 and R4 are operating.

In at least one embodiment, the zero crossover signal of the first input voltage is a signal of the sinusoidal wave of the first input voltage approach to an abscissa axis.

Figure 7:
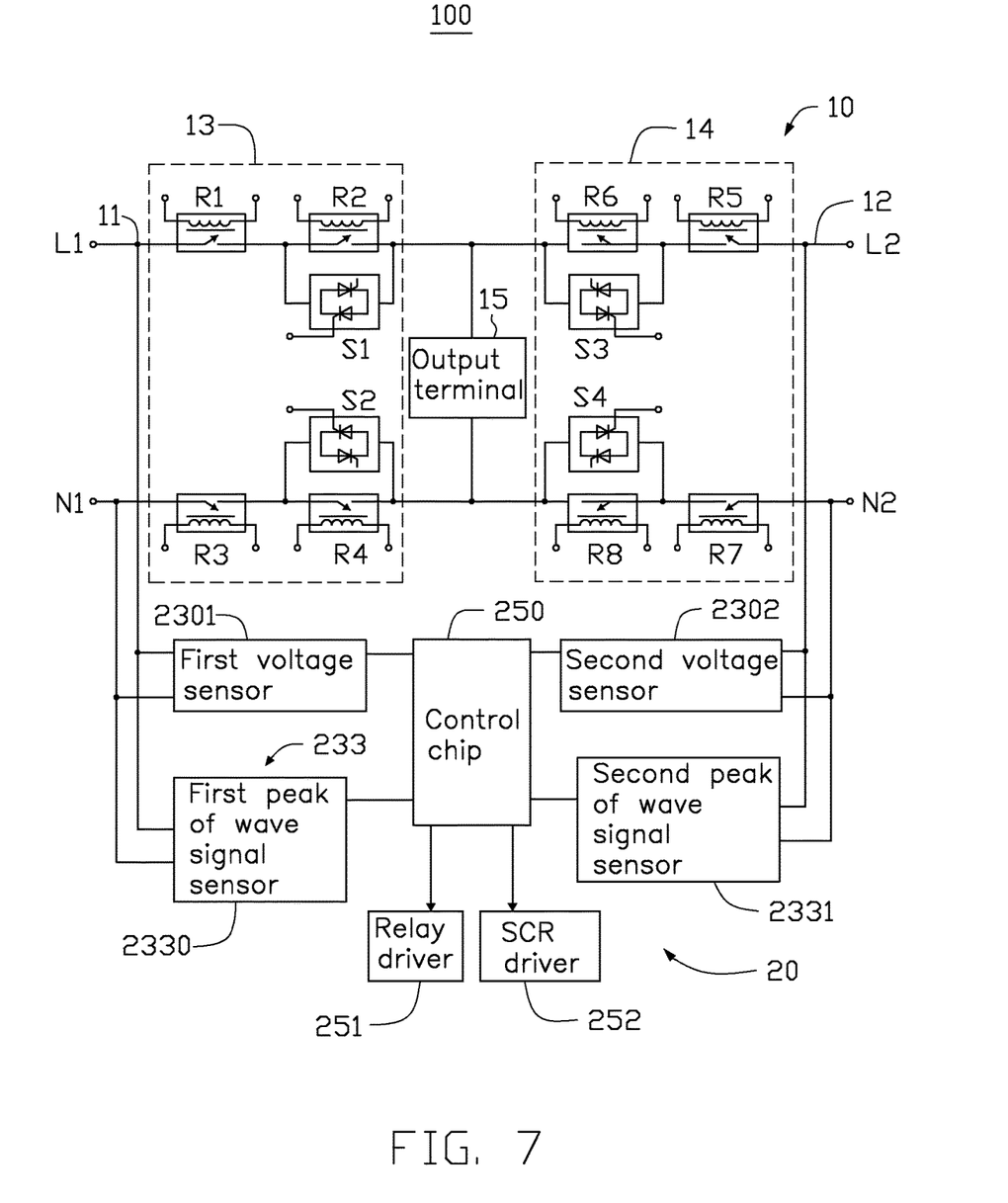
FIG. 7 is a schematic diagram of a second embodiment of the switch control device.

FIG. 7 illustrates a schematic diagram of a second embodiment of the switch control device 100. Difference from the first embodiment of the switch control device 100 is that, the detection unit 23 includes the voltage sensor 230 and a peak of wave signal sensor 233. The peak of wave signal sensor 233 includes a first peak of wave signal sensor 2330 and a second peak of wave signal sensor 2331. The first peak of wave signal sensor 2330 and the second peak of wave signal sensor 2331 are configured to receive the first input voltage and the second input voltage respectively, and detects peak of wave signal of the first or second input voltage, to transmit the peak of wave signal of the first or second input voltage to the processor 25.

In at least one embodiment, operation principle of the switch control device 100 in the first embodiment is similar as that of the second embodiment. When the output terminal 15 receives a first input voltage from the first input terminal currently, the first voltage sensor 2301 detects the first input voltage from the first input terminal 11, and transmits the first voltage to the processor 25. The first peak of wave signal sensor 2330 detects the peak of wave signal of the first input voltage, and outputs the peak of wave signal to the processor 25. The processor 25 detects the period T of the first input voltage through the first voltage sensor 2301, and determines whether the first input voltage is normal or not. If the first input voltage is abnormal, the processor 25 computes a delay time $T_{Delay}$ according to the period T of the first input voltage and the charge time $T_{Operate}$ of each relay of the first switch unit 13, and determines when to output a control signal to turn on the relays R1 and R3 of the first switch unit 13 according to the delay time $T_{Delay}$ and the peak of wave signal of the first input voltage.

Figure 8:
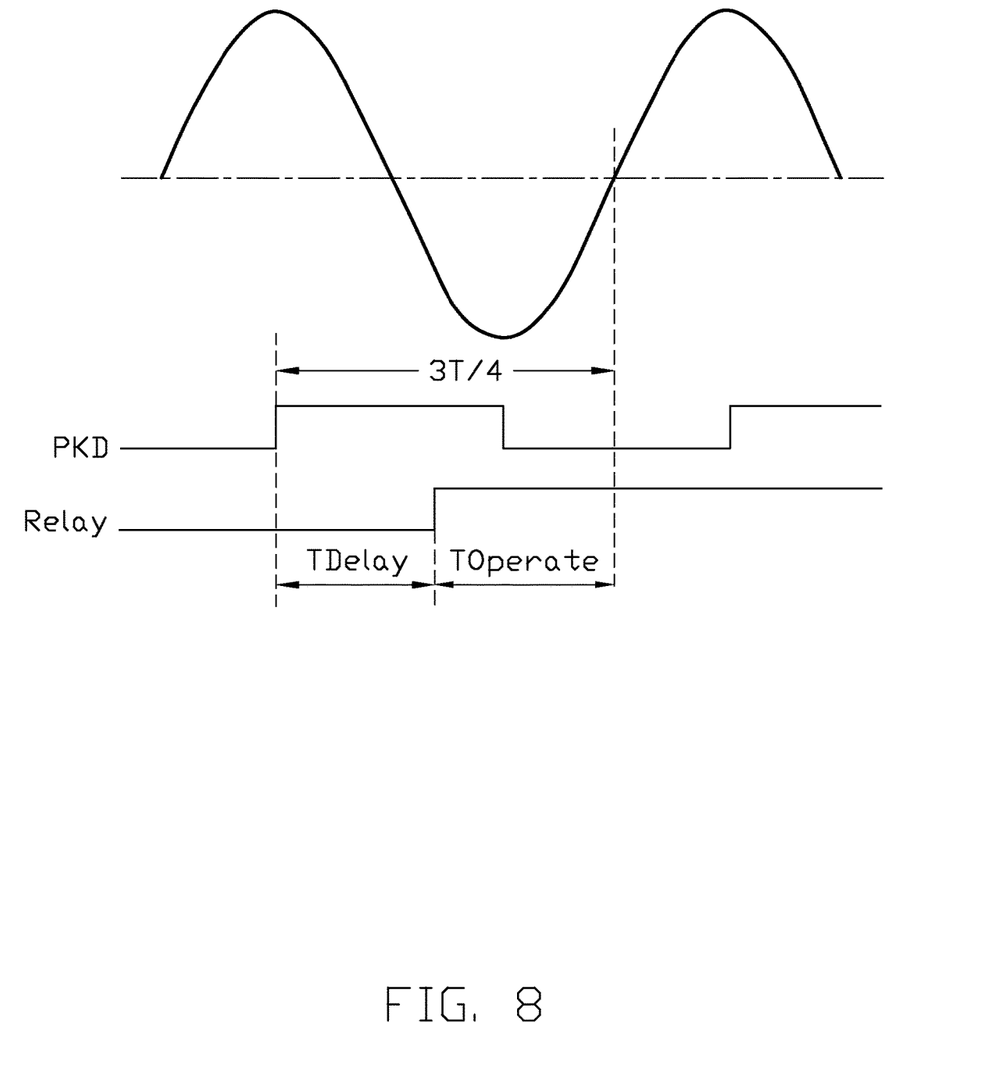
FIG. 8 is a waveform schematic diagram of the input voltage relating to a first peak of wave signal of the input voltage, which to determine a delay time of the relay of the second embodiment of the switch control device of FIG. 7.
Figure 9:
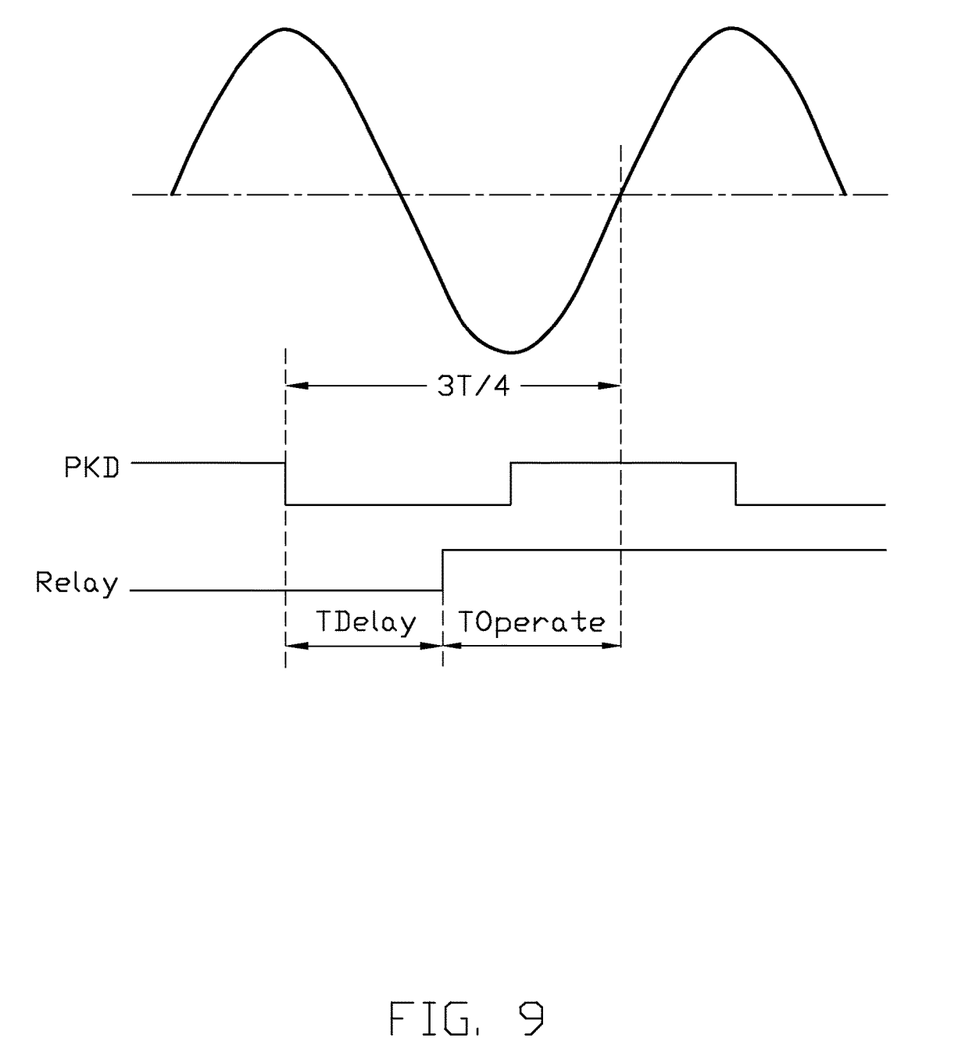
FIG. 9 is a waveform schematic diagram of the input voltage relating to a first peak of wave signal of the input voltage, which to determine a delay time of the relay of the second embodiment of the switch control device of FIG. 7.
Figure 10:
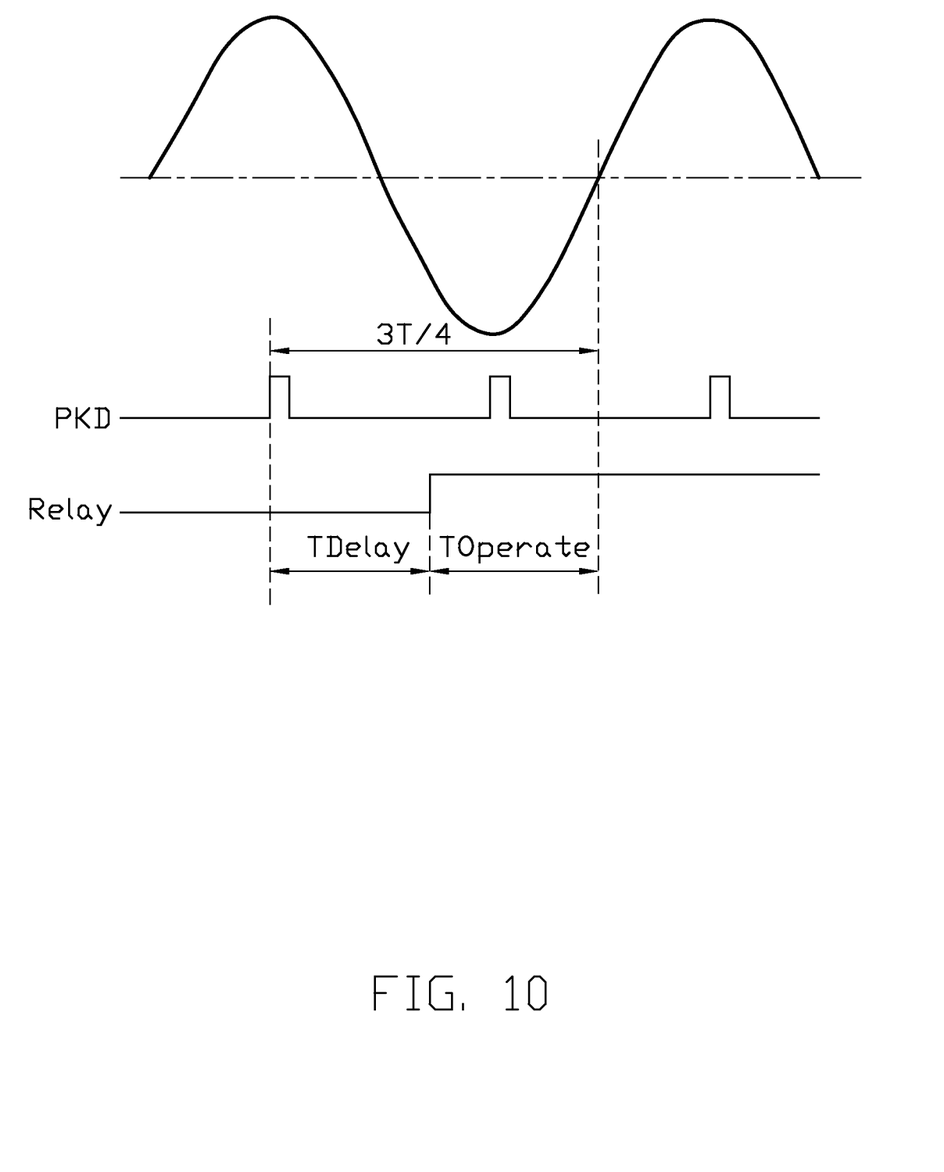
FIG. 10 is a waveform schematic diagram of the input voltage relating to a first peak of wave signal of the input voltage, which to determine a delay time of the relay of the second embodiment of the switch control device of FIG. 7.

FIGS. 8 to 10 illustrates waveform schematic diagrams of the first input voltage relating to three forms of peak of wave signal (PKD) of the first input voltage, which make the processor 25 to determine when to output the delay time $T_{Delay}$ of relays R1 and R3 (Delay) of the first switch unit 13. In at least one embodiment, a relationship between the $T_{Delay}$ and the $T_{Operate}$ as formula: $T_{Delay}$ 3T/4–$T_{Operate}$.

Therefore, the processor 25 detects the peak of wave signal (PKD) of the first input voltage and outputs the control signal to the relays R1 and R3 of the first switch unit 13 after the delay time $T_{Delay}$. When the contacts of the relays R1 and R3 of the first switch unit 13 coupled to the first input terminal 11 are turned on, and then the relays R2 and R4 will be turned on after a few time. Therefore, a voltage generated by the operation of turn on the relays R1 and R3 instantly will be reduce, which will avoid the SCRs S1 and S2 are turned on not until the relays R2 and R4 are operating.

Figure 11:
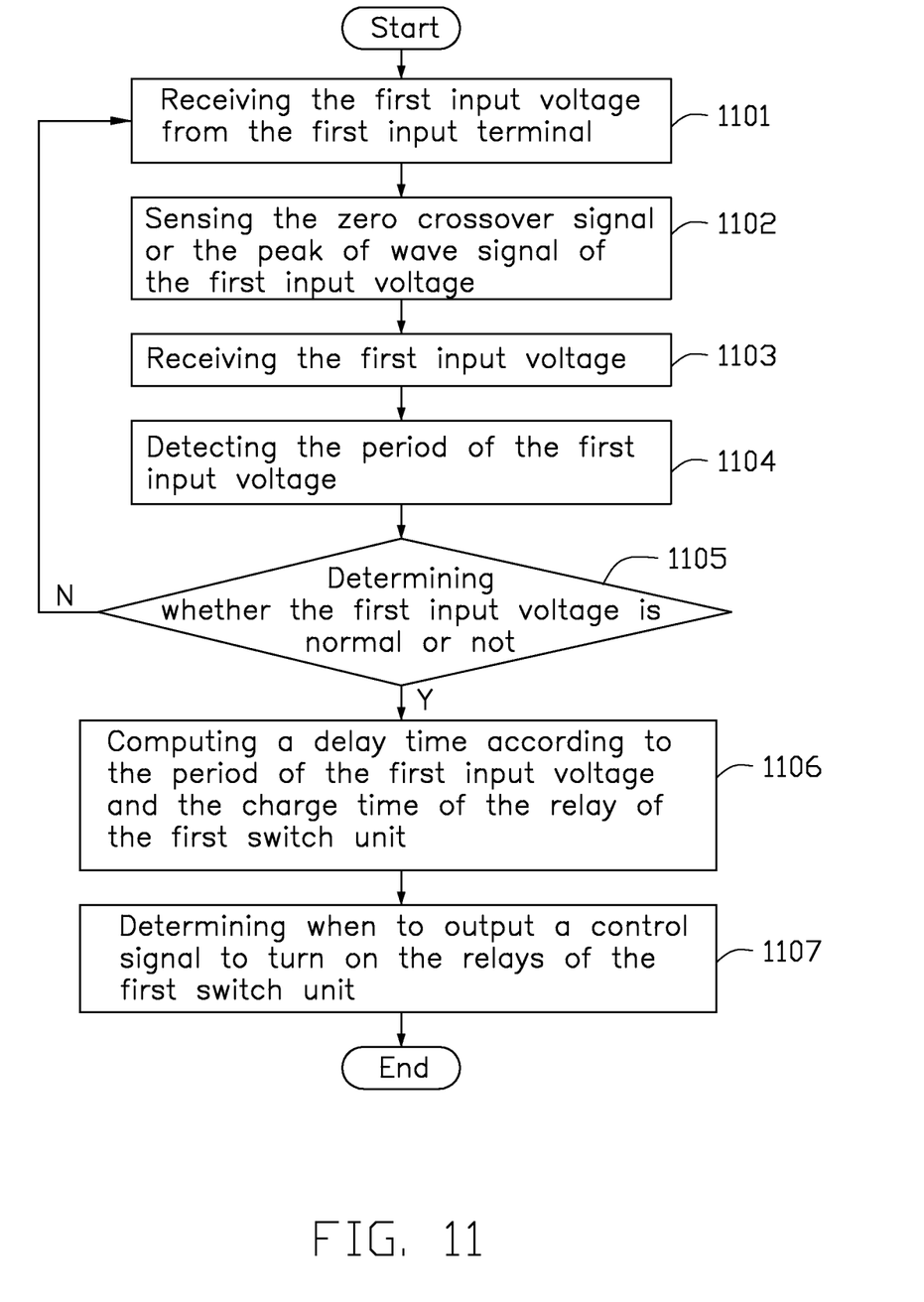
FIG. 11 is a flow chart diagram of the switch control device.

Referring to FIG. 11, a flowchart is presented in accordance with an example embodiment of a switch control device 100 which is being thus illustrated. The example method is provided by way of example, as there are a variety of ways to carry out the method. The method described below can be carried out using the configurations illustrated in FIGS. 1, 2, 3, and 7. The exemplary method can be executed by an switch control device 100, and can begin at block 1101.

At block 1101, the voltage sensor 230 receives the first input voltage from the first input terminal.

At block 1102, a sensor, such as the zero crossover signal sensor 231 or the peak of wave signal sensor 233 senses the zero crossover signal or the peak of wave signal of the first input voltage.

At block 1103, the processor 25 receives the first input voltage from the voltage sensor 230.

At block 1104, the processor 25 detects the period T of the first input voltage.

At block 1105, the processor 25 determines whether the first input voltage is normal or not, If the first input voltage is abnormal, the process goes to block 1105, otherwise, the process goes to block 1101.

At block 1106, the processor 25 computes a delay time $T_{Delay}$ according to the period T of the first input voltage and the charge time $T_{Operate}$ of the relay of the first switch unit 13.

At block 1107, the processor 25 determines when to output a control signal to turn on the relays R1 and R2 of the first switch unit 13 according to the delay time $T_{Delay}$ and the zero crossover or peak of wave signal of the first input voltage.

When the second input terminal 12 transmits the second input voltage from the second source S2 to the output terminal 15 through the second switch unit 14, and the second voltage sensor 2302 operates, the principle is similar to the first input terminal 11 transmits the first input voltage from the first source S1 to the output terminal 15 through the first switch unit 13, and the first voltage sensor 2301 operates.

While the disclosure has been described by way of example and in terms of the embodiment, it is to be understood that the disclosure is not limited thereto. On the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:

1. A switch control device comprising:
   at least one switch device comprising at least one input terminal, at least one switch unit coupled to a corresponding one of the at least one input terminal, and an output terminal, wherein each of the at least one switch unit comprising a first relay unit, a second relay unit, and a silicon controlled rectifier (SCR) coupled to the second relay unit in parallel;
   a control device comprising:
      a detection unit coupled to the at least one input terminal and configured to detect a zero crossover signal of an input voltage from the at least one input terminal;
      a processor coupled to the detection unit and the at least one switch unit, wherein the processor is configured to:
      receive the input voltage and the zero crossover signal of the input voltage;
      detect a period of the input voltage, and
      determine whether the input voltage is normal or not;
         wherein when the input voltage from the at least one input terminal is abnormal, the processor computes a delay time according to the period of the input voltage and a charge time of relays of one switch unit coupled to one input terminal from at least one input terminal and controls the relays to turn on according to the delay time and the zero crossover signal of the first zero crossover signal of the input voltage; and
      each of the switch unit further comprises third and fourth relays, a first SCR, and a second SCR; the first and second relays are coupled in series, and are coupled between a live wire of the first or second input terminal and the output terminal; the third and fourth relays are coupled in series, and are coupled between a neutral wire of the first or second input terminal and the output terminal; a first terminal of the first SCR is coupled to a node between the first relay and the second relay, a second terminal of the first SCR is coupled to the output terminal; a first terminal of the second SCR is coupled to a node between the third relay and the fourth relay, a second terminal of the second SCR is coupled to the output terminal; controls terminal of the each SCR is coupled to the processor.

2. The switch control device of claim 1, wherein switch device comprising a first input terminal, a second input terminal, a first switch unit, and a second switch unit, the first and second switch unit are coupled to the first and second input terminal respectively; the output is configured to receive a first input voltage from the first input terminal through the first switch unit, or to receive a second input voltage from the second input terminal through the second switch unit; the detection unit is coupled to the first and second input terminals, and is configured to detect a zero crossover signal of the first or second input voltage; the processor is configured to detect a period of the first or second input voltage, and detect whether the first or second input voltage is normal; when the processor detect the first input voltage is abnormal, the processor computes the delay time according to the period of the first input voltage and the charge time of relays of the first switch unit, and controls the relays to turn on according to the delay time and the zero crossover signal of the first zero crossover signal of the input voltage.

3. The switch control device of claim 2, wherein the detection unit comprises a voltage sensor and a zero crossover signal sensor, both of the voltage sensor and the zero crossover signal sensor are coupled to the first input terminal, the second input terminal, and the processor, the voltage sensor is configured to receive the first or second input voltage, and to transmit the first or second input voltage to the processor.

4. The switch control device of claim 3, wherein the zero crossover signal sensor comprises a first zero crossover signal sensor and a second zero crossover signal sensor, the first zero crossover signal sensor and the second zero crossover signal sensor are coupled to the first input terminal and the second input terminal respectively, the processor is configured to detect the zero crossover signal of the first input voltage through the first zero crossover signal sensor, or to detect the zero crossover signal of the second input voltage through the second zero crossover signal sensor.

5. The switch control device of claim 4, wherein the voltage sensor comprises a first voltage sensor and a second voltage sensor, the first voltage sensor and the second voltage sensor are coupled to the first input terminal and the second input terminal respectively, the processor is configured to detect whether the period of the first input voltage is normal or not through the first voltage sensor, or to detect whether the period of the second input voltage is normal or not through the second voltage sensor.

6. The switch control device of claim 1, wherein each of the relays is coupled to the processor.

7. A control method of a switch control device comprising:
    a voltage sensor receiving an input voltage from an input terminal;
    a signal sensor sensing a zero crossover signal or the peak of wave signal of the input voltage;
    a processor receiving the input voltage and detecting the period of the input voltage, and determining whether the input voltage is normal or not, the processor computing a delay time according to the period of the input voltage and a discharge time of relay of a first switch unit when the input voltage is abnormal; and
    the processor determining when to output a control signal to turn off of the relays of the first switch unit, according to the delay time and the zero crossover signal or the peak of wave signal of the input voltage;
    wherein the first switch unit comprises first to fourth relays, a first silicon controlled rectifier (SCR), and a second SCR; the first and second relays are coupled in series, and are coupled between a live wire of the input terminal and an output terminal; the third and fourth relays are coupled in series, and are coupled between a neutral wire of the input terminal and the output terminal; a first terminal of the first SCR is coupled to a node between the first relay and the second relay, a second terminal of the first SCR is coupled to the output terminal; a first terminal of the second SCR is coupled to a node between the third relay and the fourth relay, a second terminal of the second SCR is coupled to the output terminal; controls terminal of the each SCR is coupled to the processor.

\* \* \* \* \*